United States Patent
Park et al.

(10) Patent No.: US 10,565,497 B2
(45) Date of Patent: Feb. 18, 2020

(54) SYNAPSE AND NEUROMORPHIC DEVICE INCLUDING THE SAME

(71) Applicant: SK hynix Inc., Icheon (KR)

(72) Inventors: Sang-Su Park, Icheon (KR); Hyung-Dong Lee, Icheon (KR)

(73) Assignee: SK HYNIX INC., Icheon (KR)

( * ) Notice: Subject to any disclaimer, the term of this patent is extended or adjusted under 35 U.S.C. 154(b) by 604 days.

(21) Appl. No.: 15/389,189

(22) Filed: Dec. 22, 2016

(65) Prior Publication Data

US 2017/0193365 A1    Jul. 6, 2017

Related U.S. Application Data

(60) Provisional application No. 62/273,263, filed on Dec. 30, 2015.

(30) Foreign Application Priority Data

Nov. 4, 2016    (KR) .................. 10-2016-0146559

(51) Int. Cl.
| | |
|---|---|
| H01L 45/00 | (2006.01) |
| G06N 3/08 | (2006.01) |
| H01L 27/24 | (2006.01) |
| G06N 3/063 | (2006.01) |

(52) U.S. Cl.
CPC ............ *G06N 3/08* (2013.01); *G06N 3/0635* (2013.01); *H01L 27/2463* (2013.01); *H01L 45/04* (2013.01); *H01L 45/06* (2013.01); *H01L 45/1233* (2013.01); *H01L 45/141* (2013.01); *H01L 45/146* (2013.01); *H01L 45/147* (2013.01); *H01L 45/1683* (2013.01)

(58) Field of Classification Search
None
See application file for complete search history.

(56) References Cited

U.S. PATENT DOCUMENTS

| | | | | |
|---|---|---|---|---|
| 8,946,673 | B1 * | 2/2015 | Kumar | H01L 45/085 257/2 |
| 9,117,513 | B2 * | 8/2015 | Hwang | G11C 13/0002 |
| 9,269,901 | B2 * | 2/2016 | Hwang | H01L 45/145 |
| 9,287,501 | B1 * | 3/2016 | Chang | H01L 45/146 |
| 9,601,692 | B1 * | 3/2017 | Jo | H01L 45/1253 |

FOREIGN PATENT DOCUMENTS

KR    10-0697282 B1    3/2007

* cited by examiner

*Primary Examiner* — Ali Naraghi

(57) ABSTRACT

A neuromorphic device includes a synapse. The synapse, according to an embodiment, includes a first electrode, a second electrode spaced apart from the first electrode, an oxygen-containing layer disposed between the first electrode and the second electrode, the oxygen-containing layer including oxygen ions, and a reactive metal layer disposed between the oxygen-containing layer and the second electrode. The oxygen-containing layer includes oxygen ions. The reactive metal layer is capable of reacting with the oxygen ions of the oxygen-containing layer. A width of the reactive metal layer decreases along a direction toward the oxygen-containing layer from the second electrode.

17 Claims, 11 Drawing Sheets

SYNAPSE AND NEUROMORPHIC DEVICE INCLUDING THE SAME

CROSS-REFERENCE TO RELATED APPLICATIONS

The present application claims priority to U.S. Provisional Patent Application No. 62/273,263, filed on Dec. 30, 2015 and to Korean Patent Application No. 10-2016-0146559, filed on Nov. 4, 2016, which are incorporated herein by reference in their entirety.

BACKGROUND

1. Field

Exemplary embodiments of the present disclosure relate to neuromorphic devices that mimic a human nervous system, and their applications.

2. Description of the Related Art

Recently, as electronic appliances trend toward miniaturization, low power consumption, high performance, multi-functionality, and so on, technology capable of efficiently processing large-volume information has been demanded. In particular, neuromorphic technology for mimicking neurobiological architectures present in a human nervous system has received much attention to implement the technology of efficiently processing large-volume information. The human nervous system includes several thousand billions of neurons and synapses serving as junctions between the respective neurons. In the neuromorphic technology, neuron circuits and synapse circuits, which correspond to neurons and synapses of the human nervous system, respectively, are designed to realize neuromorphic devices. The neuromorphic devices may be used in various applications including data classification, pattern recognition, and the like.

SUMMARY

Embodiments of the present disclosure are directed to a synapse having enhanced symmetry and linearity, and to a neuromorphic device including the same.

In accordance with an embodiment, a synapse includes: a first electrode; a second electrode spaced apart from the first electrode; an oxygen-containing layer disposed between the first electrode and the second electrode, the oxygen-containing layer including oxygen ions; and a reactive metal layer disposed between the oxygen-containing layer and the second electrode, the reactive metal layer being capable of reacting with the oxygen ions of the oxygen-containing layer, and wherein a width of the reactive metal layer decreases along a direction toward the oxygen-containing layer from the second electrode.

In the above embodiment, the synapse further comprises: an insulating layer disposed against a side surface of the reactive metal layer and disposed between the first electrode and the second electrode, the insulating layer encircling the reactive metal layer. A side surface of the reactive metal layer extends between the first electrode and the second electrode at an oblique angle. A side surface of the reactive metal layer extends between the first electrode and the second electrode, the side surface having a stair shape. The reactive metal layer includes a first portion and a second portion, a width of the first portion of the reactive metal layer being substantially constant from the second electrode to a certain distance from the second electrode, a width of the second portion decreasing from the certain distance to the oxygen-containing layer. A dielectric oxide layer forms or disappears according to a voltage or current applied through the first electrode and the second electrode, the dielectric oxide layer being formed in the reactive metal layer at an interface between the reactive metal layer and the oxygen-containing layer by a reaction between the reactive metal layer and the oxygen ions. The width of a first portion of the reactive metal layer is substantially constant from the second electrode to a certain distance from the second electrode, and a width of a second portion of the reactive metal layer decreases from the certain distance to the oxygen-containing layer, and wherein the dielectric oxide layer forms or disappears in the second portion of the reactive metal layer. An electrical conductivity of the synapse decreases as a thickness of the dielectric oxide layer increases, and wherein the electrical conductivity of the synapse increases as the thickness of the dielectric oxide layer decreases. A thickness of the dielectric oxide layer increases when a number of first electrical pulses applied to the synapse increases, the first electrical pulses having a first polarity and being applied through the first and second electrodes, and wherein the thickness of the dielectric oxide layer decreases when a number of second electrical pulses applied to the synapse increases, the second electrical pulses having a second polarity opposite to the first polarity and being applied through the first and second electrodes. A volume of the dielectric oxide layer increases at a growth rate, the growth rate increasing as the number of the first electrical pulses increases. The first electrical pulses have a constant width and a constant magnitude, and wherein the second electrical pulses have a constant width and a constant magnitude. The synapse undergoes a depression operation when first electrical pulses are applied to the synapse through the first and second electrodes, an electrical conductivity of the synapse decreasing when a number of the first electrical pulses increases, the first electrical pulses having a first polarity, and wherein the synapse undergoes a potentiation operation when second electrical pulses are applied to the synapse through the first and second electrodes, the electrical conductivity of the synapse increasing when a number of the second electrical pulses increases, the second electrical pulses having a second polarity opposite to the first polarity. A change in the electrical conductivity of the synapse in the potentiation operation is substantially symmetric with a change in the electrical conductivity of the synapse in the depression operation. A rate of change in the electrical conductivity of the synapse in the potentiation operation is substantially constant, and wherein a rate of change in the electrical conductivity of the synapse in the depression operation is substantially constant. The first electrical pulses have a constant width and a constant magnitude, and wherein the second electrical pulses have a constant width and a constant magnitude. The electrical conductivity of the synapse is constant when third electrical pulses are applied to the synapse, the third electrical pulses having at least one of a width and a magnitude less than a certain critical value and having the first polarity or the second polarity.

In accordance with another embodiment, a neuromorphic device includes: a first neuron; a second neuron; a first line connected to the first neuron, the first line extending in a first direction; a second line connected to the second neuron, the second line extending in a second direction and intersecting the first line; and a synapse disposed in an intersection region between the first line and the second line, wherein the synapse comprises: an oxygen-containing layer including oxygen ions; and a reactive metal layer disposed between the oxygen-containing layer and the second line, the reactive metal layer being capable of reacting with the oxygen ions of the oxygen-containing layer, and wherein a width of the reactive metal layer decreases along a third direction toward the oxygen-containing layer from the second line.

In the above embodiment, a dielectric oxide layer forms or disappears according to a voltage or current applied to the synapse through the first line and the second line, the dielectric oxide layer being formed in the reactive metal layer at an interface between the reactive metal layer and the oxygen-containing layer by a reaction between the reactive metal layer and the oxygen ions. An electrical conductivity of the synapse decreases as a thickness of the dielectric oxide layer increases, and wherein the electrical conductivity of the synapse increases as the thickness of the dielectric oxide layer decreases. At least one of the first neuron and the second neuron drives at least one of the first line and the second line by first and second electrical pulses, the first and second electrical pulses being applied to the synapse through the at least one of the first line and the second line, the first electrical pulses having a first polarity, the second electrical pulses having a second polarity opposite to the first polarity, wherein a thickness of the dielectric oxide layer increases when a number of the first electrical pulses applied to the synapse increases, and wherein the thickness of the dielectric oxide layer decreases when a number of the second electrical pulses applied to the synapse increases. A volume of the dielectric oxide layer increases at a growth rate, the growth rate increasing as the number of the first electrical pulses increases. The synapse further comprises: an insulating layer disposed against a side surface of the reactive metal layer and disposed between the first line and the second line, the insulating layer encircling the reactive metal layer. A side surface of the reactive metal layer extends between the first line and the second line at an oblique angle. A side surface of the reactive metal layer extends between the first line and the second line, the side surface having a stair shape. The reactive metal layer includes a first portion and a second portion, a width of the first portion being substantially constant from the second line to a certain distance from the second line, a width of the second portion decreasing from the certain distance to the oxygen-containing layer.

DETAILED DESCRIPTION

Figure 1:
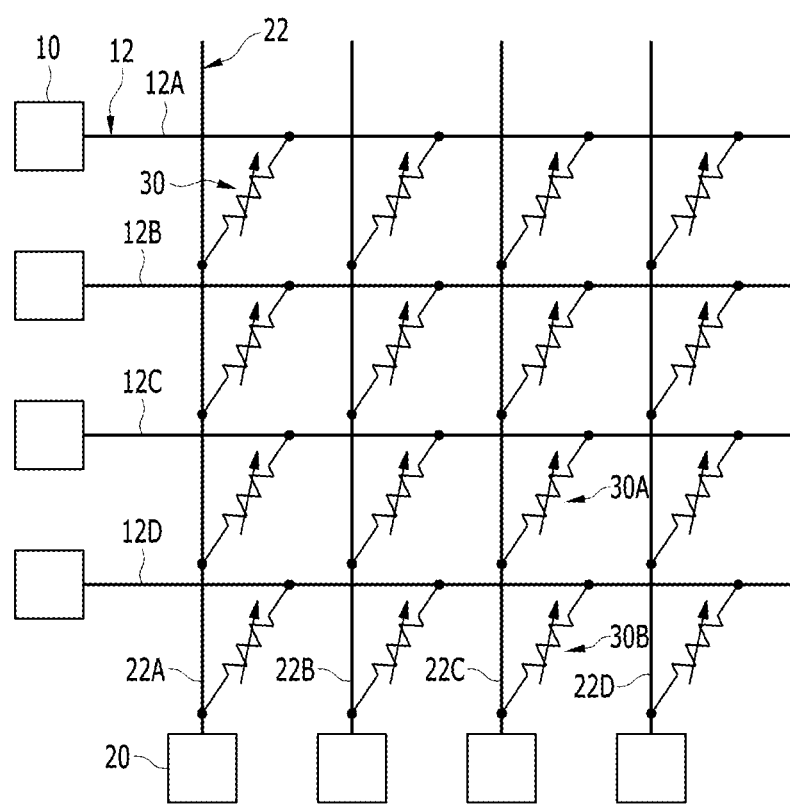
FIG. 1 illustrates a neuromorphic device according to an embodiment.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 illustrates a neuromorphic device according to an embodiment.

Referring to FIG. 1, the neuromorphic device according to the embodiment may include a plurality of pre-synaptic neurons 10, a plurality of post-synaptic neurons 20, and a plurality of synapses 30 that provide connections between the plurality of pre-synaptic neurons 10 and the plurality of post-synaptic neurons 20.

For illustrative convenience, the neuromorphic device of the embodiment shown in FIG. 1 includes four pre-synaptic neurons 10, four post-synaptic neurons 20, and sixteen synapses 30, but the numbers of pre-synaptic neurons, post-synaptic neurons, and synapses in the neuromorphic device may be changed in various ways. If the number of pre-synaptic neurons 10 is N and the number of post-synaptic neurons 20 is M, N*M synapses 30 may be arranged in a matrix form, wherein N and M are natural numbers equal to or greater than 2, and N and M may or may not be equal to each other.

For this arrangement shown in FIG. 1, the neuromorphic device may further include a plurality of first lines 12 and a plurality of second lines 22. The plurality of first lines 12 may be coupled to the plurality of pre-synaptic neurons 10, respectively, and may extend in a first direction, for example, a horizontal direction with respect to the orientation of FIG. 1. The plurality of second lines 22 may be coupled to the plurality of post-synaptic neurons 20, respectively, and may extend in a second direction crossing the first direction, for example, a vertical direction with respect to the orientation of FIG. 1. Hereinafter, for convenience of explanation, the first lines 12 will be referred to as row lines, and the second lines 22 will be referred to as column lines. The plurality of synapses 30 may be disposed at intersections between the row lines 12 and the column lines 22. Each of the synapses 30 may couple a corresponding one of the row lines 12 to a corresponding one of the column lines 22. In other words, the plurality of synapses 30 may be disposed in regions where the row lines 12 overlap with the column lines 22. That is, each of the synapses 30 may be disposed in an intersection region between the corresponding row line 15 and the corresponding column line 25.

The pre-synaptic neurons 10 may generate a signal (e.g., a signal corresponding to certain data) and transmit the generated signal to the row lines 12. The post-synaptic neurons 20 may receive, through the column lines 22, a synaptic signal corresponding to the signal that was generated by the pre-synaptic neurons 10 and has passed through the synapses 30, and may process the received signal.

The row lines 12 may correspond to axons of the pre-synaptic neurons 10, and the column lines 22 may correspond to dendrites of the post-synaptic neurons 20. However, whether a neuron of interest is a pre-synaptic neuron or a post-synaptic neuron may be determined by its relationship with another neuron. For example, a neuron receiving a synaptic signal from another neuron may function as a post-synaptic neuron. Similarly, a neuron transmitting a signal to another neuron may function as a pre-synaptic neuron. The pre-synaptic neurons 10 and the post-synaptic neurons 20 may be implemented using various circuits such as complementary metal-oxide-semiconductor (CMOS) circuits.

The pre-synaptic neurons 10 and the post-synaptic neurons 20 are electrically coupled by the synapses 30. Herein, the synapse 30 is an element that has an electrical conductance or a weight changing according to an electrical pulse (e.g., a voltage or current) applied to the synapse 30.

Each of the synapses 30 may include a variable resistance element. The variable resistance element is an element capable of switching between different resistance states according to a voltage or current that is applied to both ends thereof. The variable resistance element may have a single-layered structure, or may have a multi-layered structure that includes any of various materials. The single-layered structure may have a plurality of resistance states by itself. The multi-layered structure may have a plurality of resistance states based on a combination of the various materials. The various materials may include any of metal oxides such as transition metal oxides or perovskite-based materials, phase-change materials such as chalcogenide-based materials, ferroelectric materials, ferromagnetic materials, and the like.

An operation in which the variable resistance element of the synapse 30 switches from a high-resistance state to a low-resistance state may be referred to as a set operation, and an operation in which the variable resistance element of the synapse 30 switches from the low-resistance state to the high-resistance state may be referred to as a reset operation.

However, unlike variable resistance elements that are used in memory devices such as RRAM, PRAM, FRAM, and MRAM devices, a resistance value of the synapse 30 in the neuromorphic device does not change abruptly in the set operation and the reset operation. Instead, the synapse 30 exhibits an analog behavior in which electrical conductivity of the synapse 30 gradually changes according to the number and/or magnitude of electrical pulses applied to the synapse 30 during the set operation and the reset operation. Thus, the synapse 30 may have various characteristics distinguishable from those of a variable resistance element of another type of memory device, because the characteristics of the synapse 30 in the neuromorphic device differ from characteristics required for a variable resistance element of another type of memory device.

On the other hand, another type of memory device preferably uses a variable resistance element that maintain its electrical conductivity before a set operation or a reset operation is performed, even if electrical pulses are repeatedly applied to the variable resistance element. Accordingly, the variable resistance element may store different data by having clearly distinguished low-resistance and high-resistance states.

Meanwhile, an example of a learning operation of the neuromorphic device of FIG. 1 will be described. For convenience of explanation, the four row lines 12 may be sequentially referred to as a first row line 12A, a second row line 12B, a third row line 12C, and a fourth row line 12D, as illustrated from the top to the bottom of FIG. 1. The four column lines 22 may be sequentially referred to as a first column line 22A, a second column line 22B, a third column line 22C, and a fourth column line 22D, as illustrated from the left to the right of FIG. 1.

Each of the synapses 30 may undergo a set operation by switching from a high-resistance state to a low-resistance state, and may undergo a reset operation by switching from a low-resistance state to a high-resistance state. An electrical conductivity of each of the synapses 30 increases during a potentiation operation, and decreases during a depression operation.

In an initial stage of the learning operation, each of the synapses 30 may be in a high-resistance state. If at least one of the synapses 30 is in a low-resistance state, an initialization operation for changing the low-resistance state of the synapses 30 to the high-resistance state may be performed in order to bring the synapses 30 to the initial stage.

Each of the synapses 30 may have a certain critical value. More specifically, if a voltage or current lower than the certain critical value is applied to the synapse 30, the electrical conductivity of the synapse 30 may not change, and if a voltage or current equal to or higher than the certain critical value is applied to the synapse 30, the electrical conductivity of the synapse 30 may change.

In the initial stage, in order to perform an operation for learning certain data in any column line 22, an input signal corresponding to the certain data may be input to the row lines 12 so that an electrical pulse is selectively applied to each of the row lines 12 according to the certain data. The input signal may be input by applying electrical pulses to row lines 12 corresponding to '1' in the certain data, and not to row lines 12 corresponding to '0' in the certain data. For example, if an input signal corresponding to certain data '0011' is input to the row lines 12 of FIG. 1, an electrical pulse may not be applied to the first and second row lines 12A and 12B, and may be applied to the third and fourth row lines 12C and 12D.

While the input signal is being input, the column lines 22 may be selectively driven at a suitable voltage or current for the learning operation.

As an example, if a column line 22 to learn specific data is predetermined, the predetermined column line 22 may be driven such that synapses 30 located at intersections between the row lines 12 corresponding to '1' and the predetermined column 22 may receive a voltage equal to or higher than a set voltage. The set voltage may be a voltage required for the set operation. Simultaneously, the remaining column lines 22, which are not the predetermined column line 22, may be driven such that the remaining synapses 30 may receive a voltage lower than the set voltage. Referring to FIG. 1, the remaining synapses are synapses other than the synapses 30 located at the intersections between the row lines 12 corresponding to '1' and the predetermined column lines 22.

For example, if the magnitude of the set voltage is Vset and the third column line 22C is predetermined as a column line to learn the certain data '0011,' the magnitude of the electrical pulse that is applied to each of the third and fourth row lines 12C and 12D may be equal to or higher than Vset, and a voltage that is applied to the third column line 22C may be 0 V, such that first and second synapses 30A and 30B located at intersections between the third column line 22C and the third and fourth row lines 12C and 12D receive a voltage equal to or higher than Vset. Thus, the first and second synapses 30A and 30B may switch from the high-resistance state to a low-resistance state. That is, each of the first and second synapses 30A and 30B may undergo the set operation.

The electrical conductivity of the first and second synapses 30A and 30B in the low-resistance state may gradually increase as the number of electrical pulses applied to the first and second synapses 30A and 30B increases. That is, each of the first and second synapses 30A and 30B may undergo a potentiation operation.

On the other hand, a voltage applied to the remaining column lines 22, that is, to the first, second, and fourth column lines 22A, 22B, and 22D, may have a magnitude between 0V and Vset such that the remaining synapses 30 receive a lower voltage than Vset. For example, the voltage applied to the remaining column lines 22 may be equal to ½ Vset. Thus, resistance states of the remaining synapses 30, which are synapses 30 other than the first and second synapses 30A and 30B, may not change.

If the row lines 12 and the column lines 22 are driven in the above-described manner, the electrical conductivity of synapses 30 that receive electrical pulses may gradually increase, and thus a current flowing through the synapses 30 that receive the electrical pulses may increase. For example, the electrical conductivity of the synapses 30A and 30B may increase when the synapses 30A and 30B receive the electrical pulses from the third and fourth row lines 12C and 12D, and a current flowing to the third column line 22C through the synapses 30A and 30B may increase. When the current flowing to the third column line 22C is measured and the measured current reaches a certain critical current, the third column line 22C may be a 'column line that has leaned specific data,' for example, a column line that has learned the certain data '0011.'

As another example, a column line 22 to learn specific data may not be predetermined. In this case, a current flowing to each of the column lines 22 is measured while electrical pulses corresponding to the specific data are applied to the row lines 12. Based on the measurement results, a column line, e.g., the first column line 22A, which reached the certain critical current before the other column lines, e.g., the second to fourth column lines 22B to 22D, may be determined to be a column line that has learned the specific data.

In the above-described manner, the other column lines may learn different data in other learning operations.

Meanwhile, although the learning operation described above includes only the set operation of changing the resistance state of the synapses 30 from a high-resistance state to a low-resistance state and the potentiation operation of increasing the electrical conductivity of the synapses 30, the learning operation may also include the reset operation of changing the resistance state of the synapses 30 from the low-resistance state to the high-resistance state and the depression operation for reducing the electrical conductivity of the synapses 30.

For example, the polarity of pulses that are applied in the set operation of the synapses 30 and the potentiation operation of increasing the electrical conductivity of the synapses 30 may be opposite to the polarity of pulses that are applied in the reset operation of the synapses 30 and the depression operation of reducing the electrical conductivity of the synapses 30.

Hereinafter, characteristics of a synapse suitable for a neuromorphic device will be described in detail with reference to FIGS. 2A to 2D.

FIGS. 2A to 2D illustrate characteristics associated with each of the synapses 30 shown in FIG. 1.

Figure 2A:
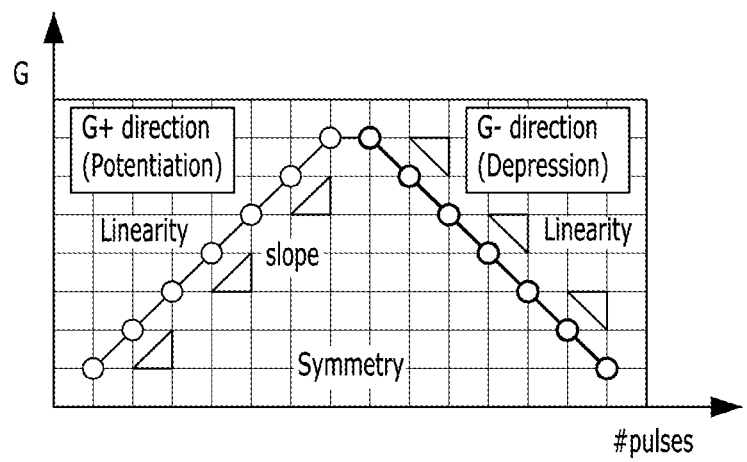
FIGS. 2A to 2D illustrate characteristics associated with each synapse shown in FIG. 1.
Figure 2B:
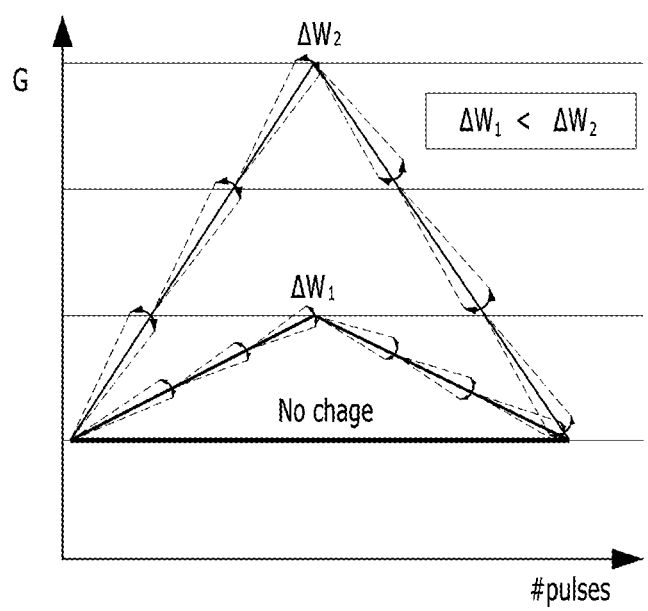
Figure 2C:
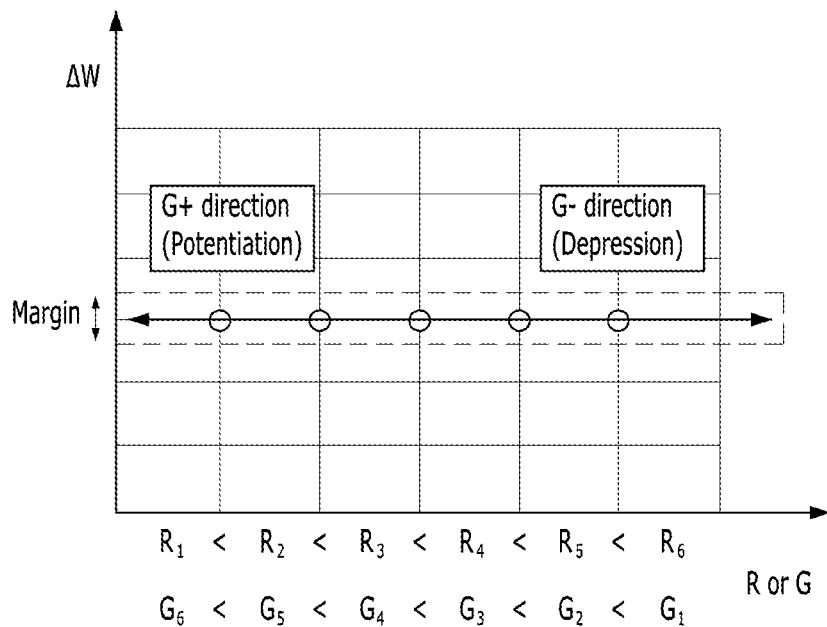
Figure 2D:
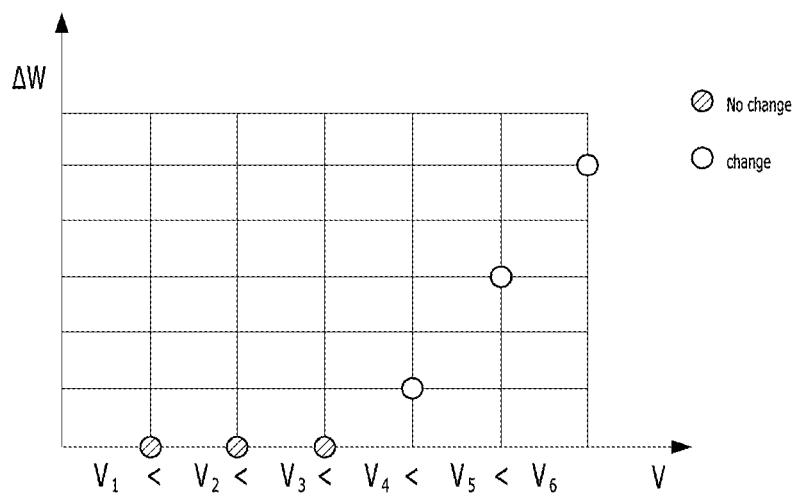

Specifically, FIGS. 2A and 2B illustrate the electrical conductivity G of a synapse 30 according to the number of electrical pulses that are applied to the synapse 30. FIG. 2C shows a change in weight ΔW of the synapse 30 with a change in resistance R or electrical conductivity G of the synapse 30. FIG. 2D shows the change in weight ΔW of the synapse 30 according to a magnitude of a voltage V that is applied to the synapse 30.

Referring to FIGS. 2A and 2B, if first-polarity voltage pulses (e.g., negative voltage pulses) with a voltage higher than a certain critical value are repeatedly applied to the synapse 30 that is in a low-resistance state, the electrical conductivity G of the synapse 30 may gradually increase. A direction in which the electrical conductivity G of the synapse 30 increases may be referred to as a G+ direction or a potentiation direction.

If second-polarity voltage pulses (e.g., positive voltage pulse) with a voltage equal to or higher than the reset voltage are applied to the synapse 30, the reset operation may be performed, such that the resistance state of the synapse 30 changes to a high-resistance state.

If second-polarity voltage pulses are repeatedly applied to the synapse 30 when the synapse 30 is in the high-resistance state, the electrical conductivity G of the synapse 30 may gradually decrease. A direction in which the electrical conductivity G of the synapse 30 decreases may be referred to as a G- direction or a depression direction.

If first-polarity voltage pulses with a voltage equal to or higher than the set voltage are applied again to this synapse 30, the set operation may be performed so that the resistance state of the synapse 30 changes again to the low-resistance state.

Herein, it is preferable that, if the magnitude and width of pluses are constant, a change in the electrical conductivity G of the synapse 30 in the potentiation operation be substantially symmetric with a change in the electrical conductivity G of the synapse 30 in the depression operation, and a rate of change in the electrical conductivity G is substantially constant in each of the potentiation operation and the depression operation. In other words, it is preferable that the electrical conductivity G of the synapse 30 has linearity and symmetry in the potentiation operation and the depression operation, such that a resistance value of the synapse 30 does not abruptly change in the set operation or the reset operation. If the magnitude and/or width of the pulses must be varied to secure the linearity and symmetry of the synapse 30, it may be necessary to implement additional circuits in the neuromorphic device to generate various pulses. The addition of additional circuits may be disadvantageous in terms of area or power. Therefore, it is preferable to control the pulses to have the constant magnitude and width while driving the synapse 30.

The linearity and symmetry of the electrical conductivity G of the synapse 30 in the potentiation operation and the depression operation may be observed in both the case in which a rate of change in the weight of the synapse 30 is small (see ΔW1 in FIG. 2B) and the case in which the rate of change in the weight of the synapse 30 is great (see ΔW2 in FIG. 2B). However, if the magnitude or width of pulses is not sufficiently large, the electrical conductivity G of the synapse 30 may not change regardless of the number of the pulses being applied to the synapse 30.

Referring to FIG. 2C, it is preferable that the rate of change in the weight ΔW of the synapse 30 be substantially constant regardless of a present state of the synapse 30, that is, the present resistance value R or present electrical conductivity G of the synapse 30.

Referring to FIG. 2D, when a voltage equal to or lower than a certain critical value is applied, for example, $V_3$, the weight W and/or electrical conductivity G of the synapse 30 may not change. Namely, the rate of change in the weight ΔW of the synapse 30 may be 0. On the other hand, at a voltage higher than the certain critical value $V_3$, for example, a voltage equal to or higher than $V_4$, the rate of change in the weight ΔW of the synapse 30 may increase. Herein, the rate of change in the weight ΔW of the synapse 30 may increase substantially in proportion to the magnitude of the voltage applied to the synapse 30.

In summary, it is preferable that the electrical conductivity G of the synapse 30 of the neuromorphic device increase or decrease substantially in proportion to the number of electrical pulses being applied to the synapse 30, regardless of the present state of the synapse 30. It is also preferable that a change in the electrical conductivity G of the synapse 30 in the potentiation operation be symmetric with a change in the electrical conductivity G of the synapse 30 in the depression operation. Herein, it is preferable that the change in the electrical conductivity G of the synapse 30 occur only at a voltage equal to or higher than the certain critical value. As the characteristics of the synapse 30 are closer to the above-described characteristics, the learning and recognition accuracy of the neuromorphic device may increase, and thus operating characteristics of the neuromorphic device may be improved.

Embodiments of the present disclosure are directed to a synapse capable of satisfying the above-described characteristics shown in FIGS. 2A to 2D to the maximum possible extent. Prior to the description of the embodiments, a synapse of a comparative example will be described.

Figure 3A:
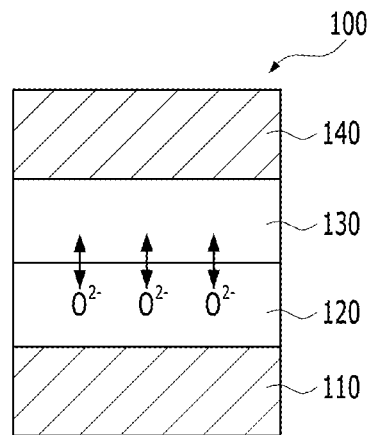
FIG. 3A is a cross-sectional view illustrating a synapse of a comparative example.
Figure 3B:
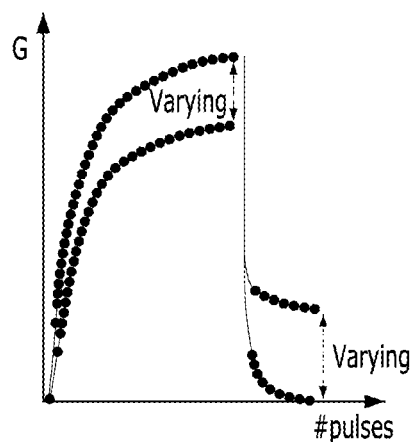
FIGS. 3B and 3C illustrate characteristics of the synapse shown in FIG. 3A.
Figure 3C:
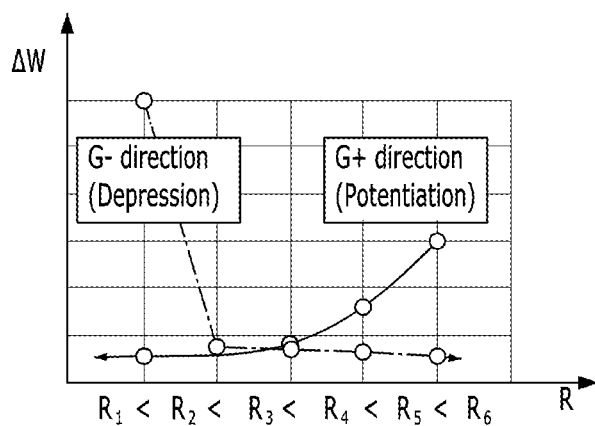

FIG. 3A is a cross-sectional view illustrating a synapse of a comparative example, and FIGS. 3B and 3C illustrate characteristics of the synapse shown in FIG. 3A.

Referring to FIG. 3A, the synapse 100 of the comparative example may include a first electrode 110, a second electrode 140, an oxygen-containing layer 120 disposed between the first electrode 110 and the second electrode 140, and a reactive metal layer 130 interposed between the oxygen-containing layer 120 and the second electrode 140. The reactive metal layer 130 is capable of reacting with oxygen ions of the oxygen-containing layer 120.

The first and second electrodes 110 and 140 may be disposed at two ends of the synapse 100 to which a voltage or current is applied, and may be formed of any of various electrically conductive materials such as metals or metal nitrides. The first electrode 110 may be connected to one of a corresponding row line 12 and a corresponding column line 22 shown in FIG. 1, and the second electrode 140 may be connected to the other one of the corresponding row line 12 and the corresponding column line 22, whereby the synapse 100 may be driven by electrical pulses. At least one of the first and second electrodes 110 and 140 may be omitted, such that the row line 12 or the column line 22 that is supposed to be coupled to the omitted electrode can function as the omitted electrode.

The oxygen-containing layer 120 is a layer containing oxygen ions, and may include any of various metal oxides, for example, oxides of transition metals such as Ti, Ni, Al, Nb, Hf, and V; perovskite-based oxides such as $Pr_{1-x}Ca_xMnO_3$ (PCMO) and $La_{1-x}Sr_xMnO_3$ (LCMO), and the like.

The reactive metal layer 130 is a layer capable of reacting with oxygen ions to form a dielectric oxide, and may include a metal such as Al, Ti, Ta, or Mo, or a nitride of the metal.

In an initial stage, the synapse 100 may be in a relatively low resistance state. Thus, to perform an operation of a neuromorphic device, an initialization operation for changing the synapse 100 from the low-resistance state to a high-resistance state may be required.

If voltage pulses with a certain polarity are applied through the first and second electrodes 110 and 140 to the synapse 100 when the synapse 100 in the low-resistance state, oxygen ions in the oxygen-containing layer 120 may move toward the reactive metal layer 130 and then react with a metal included in the reactive metal layer 130, thereby forming a dielectric oxide layer at an interface between the oxygen-containing layer 120 and the reactive metal layer 130. The dielectric oxide layer may include an oxide of the metal included in the reactive metal layer 130. As a result, the synapse 100 may undergo the reset operation and the resistance state of the synapse 100 may be changed to a high-resistance state. As the number of voltage pulses applied to the synapse 100 increases, a thickness of the dielectric oxide layer may increase, and thus the synapse 100 may undergo the depression operation such that the electrical conductivity of the synapse 100 may progressively decrease.

In contrast, if voltage pulses with a polarity opposite to the certain polarity are applied to the synapse 100 when the synapse 100 in the high-resistance state, oxygen ions may move in a direction from the reactive metal layer 130 toward the oxygen-containing layer 120, and thus the thickness of the dielectric oxide layer may decrease or the dielectric oxide layer may disappear. As a result, the synapse 100 may undergo the set operation and the resistance state of the synapse 100 may be changed to the low-resistance state. As the number of voltage pulses applied to the synapse 100 increases, the thickness of the dielectric oxide layer may decrease, and the synapse 100 may undergo the potentiation operation such that the electrical conductivity of the synapse 100 may progressively increase.

As described above, as the thickness of the dielectric oxide layer progressively increases or decreases by the voltage pulses applied to the synapse 100, the resistance state of the synapse 100 switches between the high-resistance state and the low-resistance state. Thus, the synapse 100 may have an analog behavior, such that the electrical conductivity of the synapse 100 in each of the high-resistance state and the low-resistance state progressively changes. However, this does not satisfy the characteristics described above with reference to FIGS. 2A to 2D. The characteristics of the synapse 100 will be described in detail with reference to FIGS. 3B and 3C.

Referring to FIG. 3B, if first-polarity voltage pulses are applied to the synapse 100 that is in the low-resistance state, the synapse 100 may undergo the potentiation operation and the electrical conductivity G of the synapse 100 may progressively increase as the number of the voltage pulses increases. However, a rate of increase in the electrical conductivity G is very high in an initial stage of the set operation and gradually decreases as the potentiation operation progresses. Thus, there is a problem in that the linearity of the synapse 100 is not satisfied.

In addition, if second-polarity voltage pulses with a voltage equal to or higher than a reset voltage are applied to the synapse 100 that is the low-resistance state, the reset operation may be performed such that the resistance state of the synapse 100 changes to the high-resistance state. With an increase in the number of second-polarity voltage pulses applied to the synapse 100 in the high-resistance state, the synapse 100 may undergo the depression operation and the electrical conductivity G of the synapse 100 may progressively decrease. However, an abrupt decrease in the electrical conductivity G may occur in the reset and depression operations. In addition, the rate of decrease in the electrical conductivity G is very high in an initial stage of the reset operation and gradually decreases as the depression operation progresses. The degree of decrease in the electrical conductivity G in the initial stage of the reset operation may be much larger than the degree of increase in the electrical conductivity G in the initial stage of the set operation. Thus, as shown in FIG. 3B, there is a problem in that the linearity and symmetry of the synapse 100 are not satisfied.

Referring to FIG. 3C, a rate of change in weight ΔW of the synapse 100 is not constant according to a current resistance R of the synapse 100. In the set operation, if the current resistance R of the synapse 100 is relatively high (e.g., $R_5$ or $R_6$), the rate of change in the weight ΔW of the synapse 100 may increase in the G+ direction. In other words, in the initial stage of the set operation when the synapse 100 has the relatively high resistance, the rate of change in the electrical conductivity G of the synapse 100 may be high. In contrast, in the reset operation when the current resistance R of the synapse 100 is relatively low (e.g., $R_1$), the rate of change in the weight ΔW of the synapse 100 may increase in the G− direction. In other words, in the initial stage of the reset operation when the synapse 100 has the relatively low resistance, the rate of change in the electrical conductivity G of the synapse 100 may be high. This suggests that the linearity of the synapse 100 is not satisfied.

Additionally, in the initial stage, the rate of change in the weight ΔW in the G− direction is higher than the rate of change in the weight ΔW in the G+ direction, as shown in FIG. 3C. This indicates that the symmetry of the synapse 100 is not satisfied.

The reason why the above-described problems arise are that the rate of change in the resistance R of the synapse 100 in each of the initial stages of the set and reset operations is high, and that the speed of the reset operation in which the dielectric oxide layer is formed is much higher than the speed of the set operation in which the dielectric oxide layer disappears.

Embodiments of the present disclosure are directed to synapses capable of overcoming the problems of the comparative example.

Figure 4:
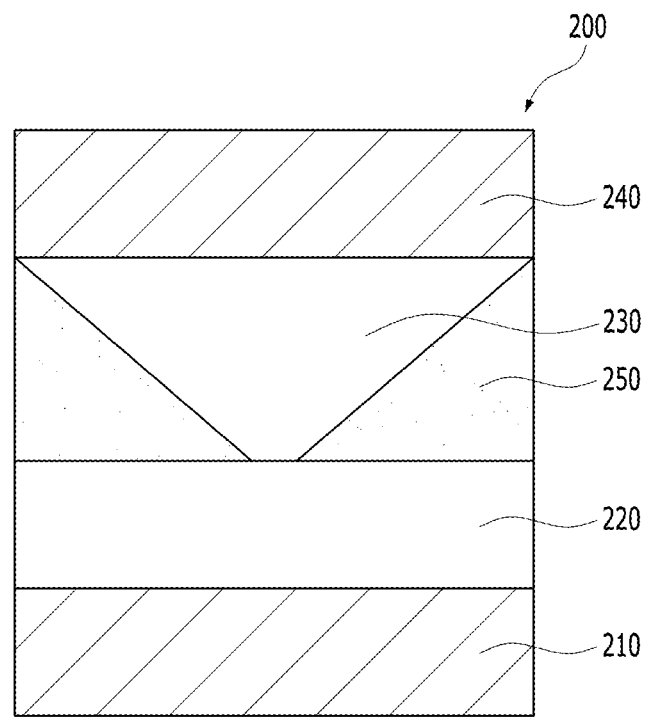
FIG. 4 is a cross-sectional view illustrating a synapse according an embodiment.

FIG. 4 is a cross-sectional view illustrating a synapse 200 according an embodiment.

Referring to FIG. 4, the synapse 200 may include a first electrode 210, a second electrode 240, an oxygen-containing layer 220 disposed between the first electrode 210 and the second electrode 240, and a reactive metal layer 230 disposed between the oxygen-containing layer 220 and the second electrode 240.

The first and second electrodes 210 and 240 may be disposed at two ends of the synapse 200, and may include any of various electrically conductive materials such as metals or metal nitrides. A voltage or current may be applied to each of the first and second electrodes 210 and 240. The first electrode 210 may be connected to one of the row lines 12 shown in FIG. 1, and the second electrode 240 may be connected to one of the column lines 22 shown in FIG. 1, or vice versa. The synapse 200 may be driven by electrical pulses input through the first and second electrodes 210 and 240. In an embodiment, at least one of the first and second electrodes 210 and 240 may be omitted, and one of the row lines 12 or one of the column lines 22 may be substituted for the omitted first electrode 210 or the omitted second electrode 240.

The oxygen-containing layer 220 contains oxygen, and may include any of various metal oxides, for example, oxides of transition metals such as Ti, Ni, Al, Nb, Hf, and V, perovskite-based oxides such as PCMO and LCMO, and the like.

The reactive metal layer 230 may be capable of reacting with oxygen ions to form a dielectric oxide, and may include a metal such as Al, Ti, Ta, or Mo, or a nitride of the metal.

A width of the reactive metal layer 230 may gradually decrease in a direction from the second electrode 240 toward the oxygen-containing layer 220. That is, a surface of the reactive metal layer 230 facing the second electrode 240 may have the largest width of the reactive metal layer 230, and a surface of the reactive metal layer 230 facing the oxygen-containing layer 220 may have the smallest width of the reactive metal layer 230. In this embodiment, a cross section of the reactive metal layer 230 may have a trapezoidal shape with a bottom side having a smaller width than a top side of the trapezoidal shape. However, a shape of the reactive metal layer 230 may be variously modified, as long as the width of the reactive metal layer 230 decreases in the direction from the second electrode 240 toward the oxygen-containing layer 220. Examples of various shapes of the reactive metal layer 230 will be described later by way of example with reference to FIGS. 6A to 6D.

A side surface of the reactive metal layer 230 may be disposed against an insulating layer 250, such that the reactive metal layer 230 may be encircled by the insulating layer 250. The insulating layer 250 may include any of various insulating materials such as a silicon oxide, a silicon nitride, or a combination thereof.

In an initial stage, as shown in FIG. 4, a dielectric oxide layer may be absent from an interface between the oxygen-containing layer 220 and the reactive metal layer 230. When the dielectric oxide layer is absent, the synapse 200 may be in a low-resistance state.

If voltage pulses with a certain polarity are applied through the first and second electrodes 210 and 240 to the synapse 200 when the synapse 200 is in the low-resistance state, oxygen ions in the oxygen-containing layer 220 may move toward the reactive metal layer 230 and react with a metal included in the reactive metal layer 230. The reaction between the oxygen ions and the metal in the reactive metal layer 230 forms the dielectric oxide layer (not pictured) at the interface between the oxygen-containing layer 220 and the reactive metal layer 230. The dielectric oxide layer may include an oxide of the metal included in the reactive metal layer 230. As a result, the resistance state of the synapse 200 may be changed from the low-resistance state to a high-resistance state. That is, the synapse 200 may undergo a reset operation.

As the number of the voltage pulses applied to the synapse 200 increases when the synapse 200 is in the high-resistance state, a thickness of the dielectric oxide layer may increase, and thus, the electrical conductivity of the synapse 200 may progressively decrease. That is, the synapse 200 may undergo a depression operation.

In contrast, if voltage pulses with a polarity opposite to the certain polarity are applied to the synapse 200 when the synapse 200 is in the high-resistance state, oxygen ions may move in a direction from the reactive metal layer 230 toward the oxygen-containing layer 220. In other words, oxygen atoms bonded with the metal in the reactive metal layer 230 may move from the dielectric oxide layer to the oxygen-containing layer 220. Thus the dielectric oxide layer may become thinner or may disappear. As a result, the resistance state of the synapse 200 may be changed from the high-resistance state to the low-resistance state. That is, the synapse 200 may undergo a set operation.

As the number of the opposite-polarity voltage pulses applied to the synapse 200 increases, the thickness of the dielectric oxide layer may decrease, and thus, the electrical conductivity of the synapse 200 may progressively increase. That is, the synapse 200 may undergo a potentiation operation.

By the aforementioned operations, the thickness of the dielectric oxide layer is progressively increased or decreased by voltage pulses applied to the synapse 200 while the resistance state of the synapse 200 switches between the high-resistance state and the low-resistance state. Thus, the synapse 200 may exhibit an analog behavior, in which the electrical conductivity of the synapse 200 in each of the high-resistance state and the low-resistance state progressively changes.

In addition, since the width of the reactive metal layer 230 is the smallest at the interface with the oxygen-containing layer 220, and the width of the reactive metal layer 230 increases as a distance from the interface with the oxygen-containing layer 220 increases, an abrupt decrease in the electrical conductivity of the synapse 200, which could otherwise occur in the initial stage of the reset operation, may be prevented, and an electrical conductivity reduction rate may be lower during the reset operation. As a result, is an abrupt change in the electrical conductivity of the synapse 200 in the reset operation compared to the set operation may be prevented, and the linearity and symmetry of the synapse 200 may be improved. The reset operation will be described with reference to FIGS. 5A to 5C in more detail.

Figure 5A:
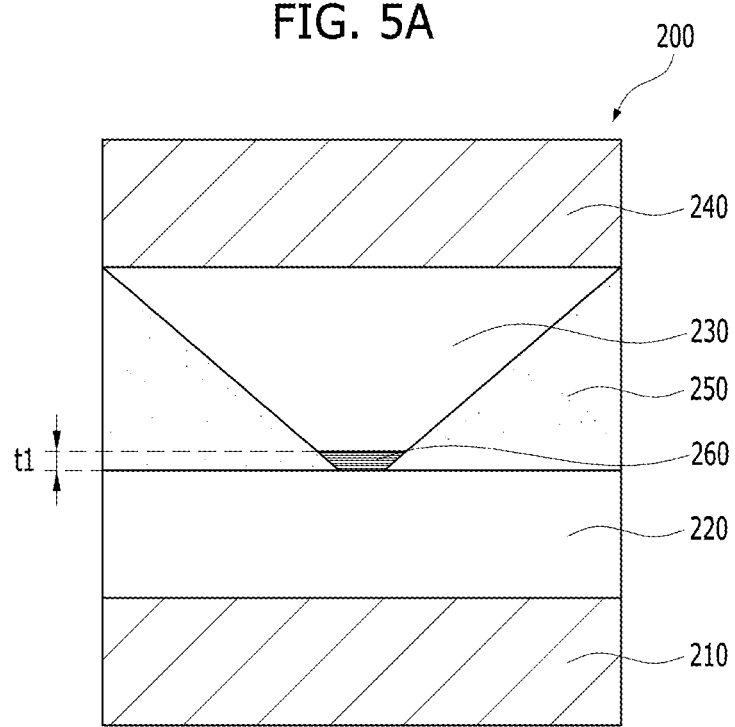
FIGS. 5A to 5C are cross-sectional views illustrating a reset operation of the synapse shown in FIG. 4.
Figure 5B:
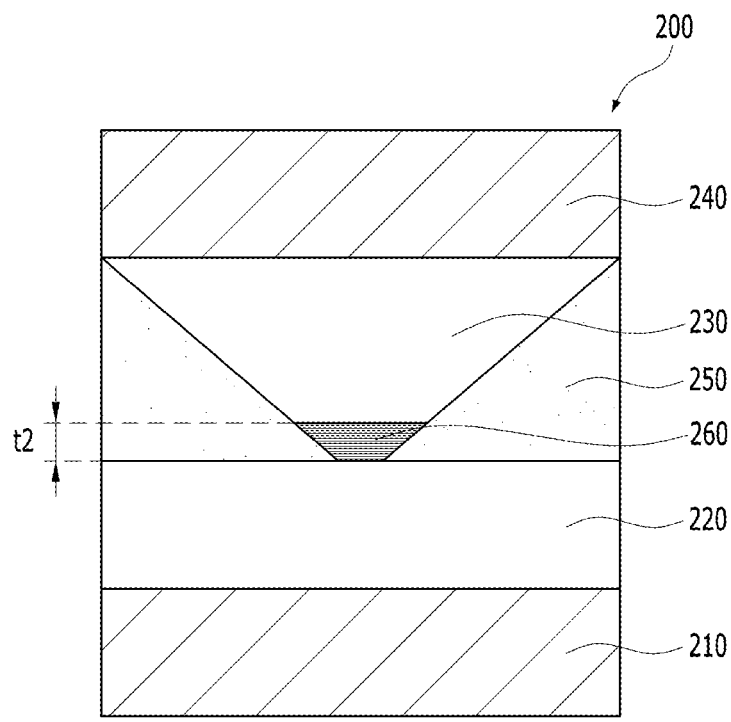
Figure 5C:
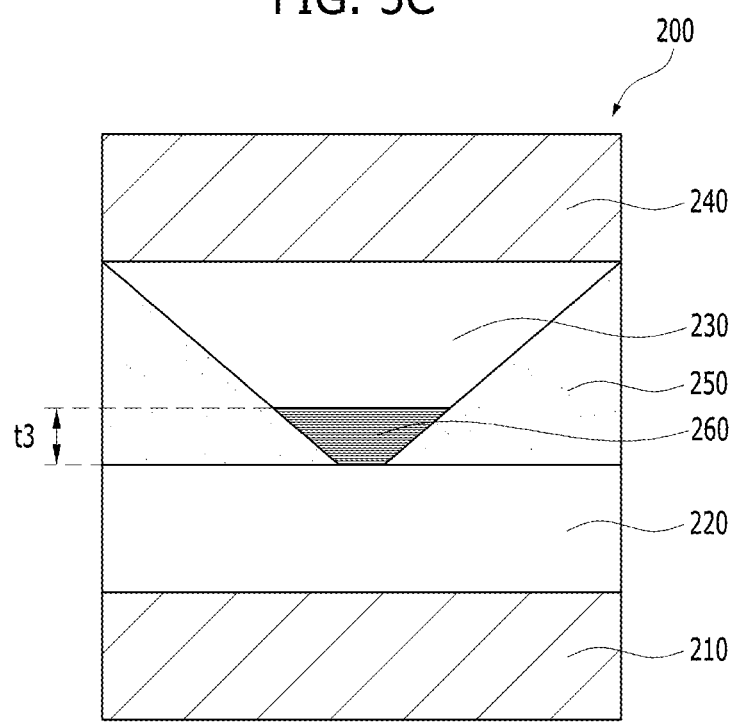

FIGS. 5A to 5C are cross-sectional views illustrating a reset operation of the synapse 200 shown in FIG. 4.

Referring to FIG. 5A, in the initial stage of the reset operation, a dielectric oxide layer 260 having a first thickness t1 may be formed at the lowermost portion of the reactive metal layer 230, that is, at the interface between the reactive metal layer 230 and the oxygen-containing layer 220. Since a width of the lowermost portion of the reactive metal layer 230 is relatively small, the dielectric oxide layer 260 may have a relatively small width and/or volume. Therefore, an abrupt increase in a resistance value of the synapse 200 during the initial stage of the reset operation may be prevented.

Referring to FIG. 5B, as a number of reset voltage pulses applied to the synapse 200 increases, the thickness of the dielectric oxide layer 260 may gradually increase and the electrical conductivity of the synapse 200 may decrease. That is, the synapse 200 may undergo a depression operation. As the depression operation proceeds, the thickness of the dielectric oxide layer 260 may gradually increase to reach a second thickness t2 that is larger than the first thickness t1. While the thickness of the dielectric oxide layer 260 increases to the second thickness t2, the dielectric oxide layer 260 expands into the reactive metal layer 230 in a direction from the oxygen containing layer 220 toward the second electrode 240. Accordingly, the width of the top surface of the dielectric oxide layer 260 may gradually increase as the depression operation proceeds, and thus the resistance value of the synapse 200 may increase more rapidly in a middle stage of the depression operation compared with the initial stage of the reset operation.

Referring to FIG. 5C, as the depression operation progresses further, the thickness of the dielectric oxide layer 260 may gradually increase to reach a third thickness t3 that is larger than the second thickness t2. As the thickness of the dielectric oxide layer 260 increases to the third thickness t3, the width of the top surface of the dielectric oxide layer 260 may gradually increase. As a result, the resistance value of the synapse 200 may increase more rapidly in a later stage of the depression operation compared with the initial stage of the reset operation and the middle stage of the depression operation. That is, the rate at which the resistance value of the synapse 200 increases during the depression operation increases as the number of reset voltage pulses applied to the synapse 200 increases.

As described above with reference to the comparative example of FIGS. 3A to 3C, the electrical conductivity of the synapse 100 problematically decreases rapidly at the initial stage of the reset operation, and then decreases relatively slowly at later stages of the depression operation. On the other hand, in the embodiment illustrated by FIGS. 4 and 5A to 5C, since a volume of the dielectric oxide layer 260 is relatively small in the initial stage of the reset operation, an abrupt decrease in the electrical conductivity of the synapse 200 as the synapse 200 initially switches from the low-resistance state to the high-resistance state may be prevented. Also, in this embodiment, since a growth rate of the volume of the dielectric oxide layer 260 gradually increases as the depression operation progresses, a rate of decrease in the electrical conductivity of the synapse 200 may increase as the reset operation progresses, in contrast to the synapse 100 of the comparative example. In other words, the synapse 200 may compensate for the decreasing rate of change in electrical conductivity during the depression operation observed in the comparative example.

FIGS. 6A to 6D are cross-sectional views illustrating modified examples of the synapse of FIG. 4. Detailed descriptions of features substantially the same as those of the synapse 200 of FIG. 4 will be omitted.

Figure 6A:
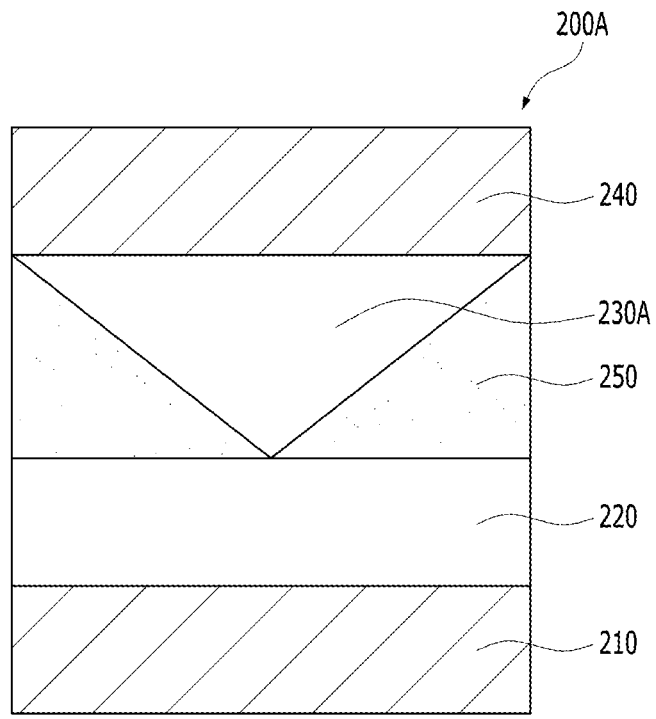
FIGS. 6A to 6D are cross-sectional views illustrating modified examples of the synapse shown in FIG. 4.

Referring to FIG. 6A, a synapse 200A according to another embodiment may include a first electrode 210, a second electrode 240, an oxygen-containing layer 220 disposed between the first electrode 210 and the second electrode 240, and a reactive metal layer 230A disposed between the oxygen-containing layer 220 and the second electrode 240.

A cross-section of the reactive metal layer 230A may have an inverted triangular shape. For example, the reactive metal layer 230A may have a vertex facing the oxygen-containing layer 220, and may have a width that gradually increases as a distance from the oxygen-containing layer 220 increases. The vertex of the reactive metal layer 230A may touch a surface of the oxygen-containing layer 220.

Figure 6B:
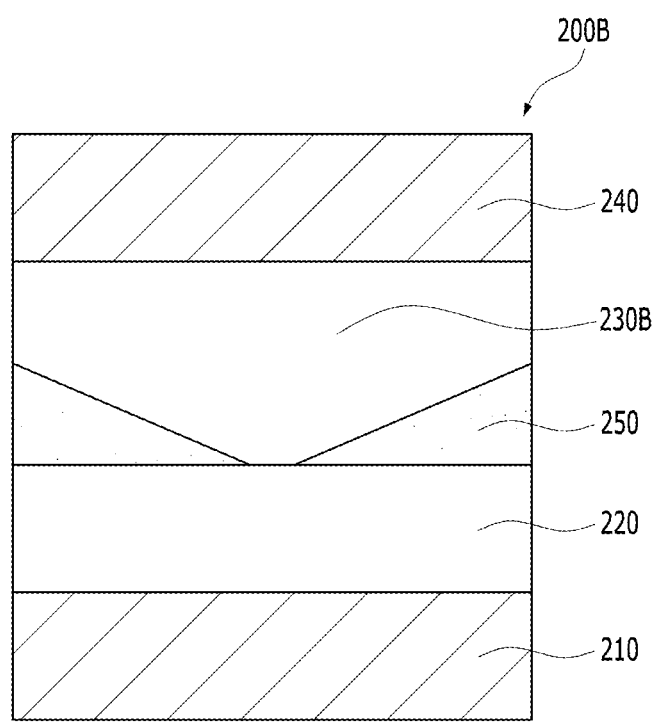

Referring to FIG. 6B, a synapse 200B according to still another embodiment may include a first electrode 210, a second electrode 240, an oxygen-containing layer 220 disposed between the first electrode 210 and the second electrode 240, and a reactive metal layer 230B disposed between the oxygen-containing layer 220 and the second electrode 240.

The reactive metal layer 230B may have a first portion and a second portion. A width of the first portion may be constant. The first portion may extend from the second electrode 240 to a certain distance from the second electrode 240. A width of the second portion may gradually decrease from the certain distance to the oxygen-containing layer 220.

Figure 6C:
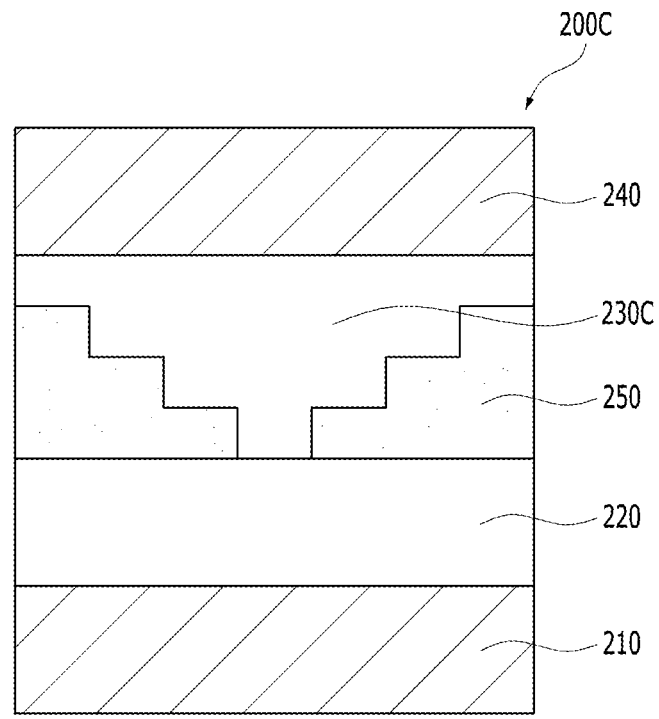

Referring to FIG. 6C, a synapse 200C according to further still another embodiment may include a first electrode 210, a second electrode 240, an oxygen-containing layer 220 disposed between the first electrode 210 and the second electrode 240, and a reactive metal layer 230C disposed between the oxygen-containing layer 220 and the second electrode 240.

The width of the reactive metal layer 230C may decrease from the second electrode 240 to the oxygen-containing layer 220 in steps, such that at least one side surface of the reactive metal layer 230C may have a stair shape. That is, the side surface may be stepped. The width of the reactive metal layer 230C may decrease in stages from the second electrode 240 toward the oxygen-containing layer 220, in contrast to the width of each of the reactive metal layers 230 and 230A of FIGS. 4 and 6A, which gradually decreases.

Figure 6D:
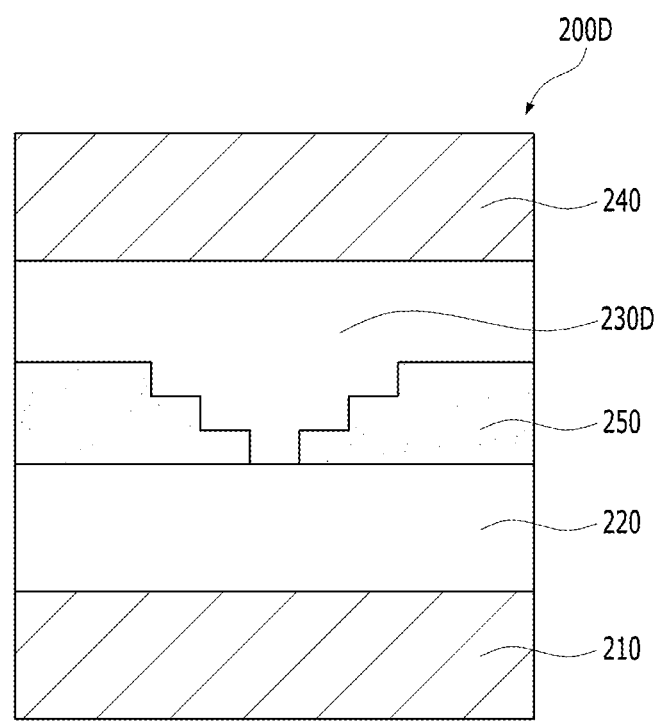

Referring to FIG. 6D, a synapse 200D according to further still another embodiment may include a first electrode 210, a second electrode 240, an oxygen-containing layer 220 disposed between the first electrode 210 and the second electrode 240, and a reactive metal layer 230D disposed between the oxygen-containing layer 220 and the second electrode 240.

The reactive metal layer 230D may include a first portion and a second portion. A width of the first portion may be constant. The first portion may extend from the second electrode 240 to a certain distance from the second electrode 240. A width of a second portion may decrease from the certain distance to the oxygen-containing layer 220 in steps. Specifically, at least one side surface of the second portion of the reactive metal layer 230D may have a stair shape. In this case, the width of the second portion of the reactive metal layer 230D may decrease by stages from the second electrode 240 toward the oxygen-containing layer 220.

In each of the above embodiments of FIGS. 6A to 6D, the reset operation may be performed in the same manner. A dielectric oxide layer may be formed in a region of each of the reactive metal layers 230A, 230B, 230C, and 230D. Like the width of each of the corresponding reactive metal layers 230A, 230B, 230C, and 230D, a width of the dielectric oxide layer may gradually decrease along a direction toward the oxygen-containing layer. For example, in each of the embodiments of FIGS. 6B and 6D, the dielectric oxide layer may be formed and/or removed in the second portion of the reactive metal layer 230B or 230D, in which the width of the reactive metal layer 230B or 230D decreases, and may not be formed and/or removed in the first portion of the reactive metal layer 230B or 230D, in which the width of the reactive metal layer 230B or 230D is constant. That is, the dielectric oxide layer may be disposed in a region spaced apart from the second electrode 240, and may not be disposed in a region adjacent to the second electrode 240.

FIGS. 7A to 7D are cross-sectional views illustrating a method for fabricating synapses according to an embodiment.

Figure 7A:
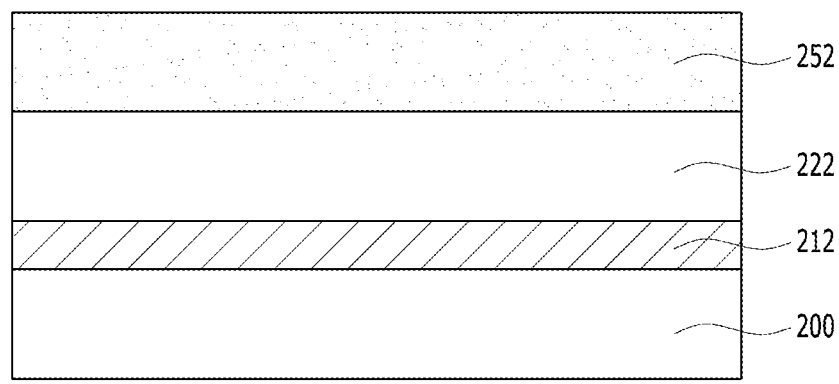
FIGS. 7A to 7D are cross-sectional views illustrating a method for fabricating synapses according to an embodiment.

Referring to FIG. 7A, a substrate 200, in which a certain lower structure (not shown) is formed, may be provided. The certain lower structure may include a line to be coupled to the synapses and to control the synapses, etc. This line may correspond to one of the row lines 12 or one of the column lines 22 of FIG. 1.

After the substrate 200 has been provided, a first electrode material 212, an oxygen-containing material 222, and an insulating material 252 may be sequentially deposited over the substrate 200.

Figure 7B:
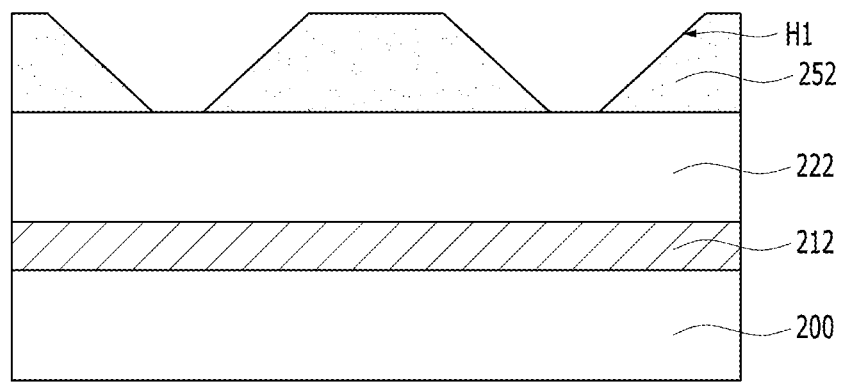

Referring to FIG. 7B, one or more holes H1 exposing the oxygen-containing material 222 may be formed in the insulating material 252 by selectively etching the insulating material 252.

The selective etching of the insulating material 252 may be performed using a dry etching process, in which a polymer is formed as the insulating material 252 is etched. In this case, as the insulating material 252 is etched, the polymer may accumulate on the etched sidewall of each hole H1 in the insulating material 252. As a result, a width of each hole H1 may decrease along a direction from the top of the hole H1 toward the bottom of the hole H1. That is, the width of the hole H1 may decrease in a direction toward the oxygen-containing material 222. In this embodiment, each hole H1 may have a sidewall disposed at an oblique angle with respect to a top surface of the oxygen-containing material 222, and the bottom of each hole H1 may have a certain width. However, by adjusting process conditions, the sidewall of the hole H1 may have a stair shape, a concave-convex shape, etc. Also, by adjusting process conditions, the bottom of the hole H1 may have a very small width, such that the bottom of the hole H1 exposes the oxygen-containing material 222 at a point.

Figure 7C:
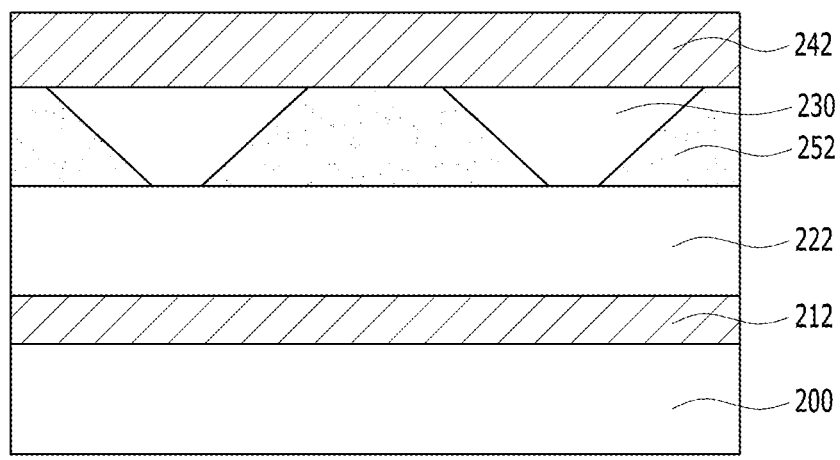

Referring to FIG. 7C, a reactive metal layer 230 filling each hole H1 may be formed by depositing a reactive metal material over the structure of FIG. 7B, and then performing a planarization process until the insulating material 252 is exposed. The planarization process may include Chemical Mechanical Polishing (CMP). The reactive metal layer 230 may include a portion of the reactive metal material that remains in each hole H1 after the planarization process is performed.

Then, a second electrode material 242 may be formed over the insulating material 252 and the reactive metal layer 230.

Figure 7D:
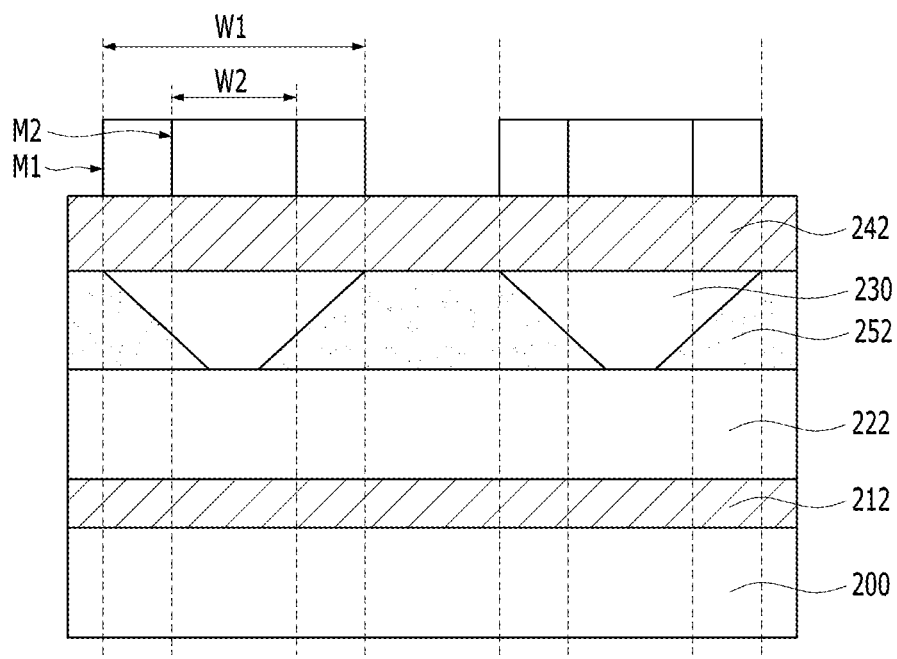

Referring to FIG. 7D, a first mask pattern M1 for patterning the synapses may be formed over the second electrode material 242. The first mask pattern M1 may overlap each hole H1, and may have widths that are each substantially the same as each hole H1. That is, each part of the first mask pattern M1 may be as wide as the widest part of each hole H1.

Then, the second electrode material 242, the insulating material 252, the oxygen-containing material 222, and the first electrode material 212 may be etched using the first mask pattern M1 as an etching barrier, thereby forming the synapse 200 shown in FIG. 4, for example.

However, another mask pattern for patterning the synapses may have any of various widths and/or shapes when it overlaps each hole H1. For example, instead of the first mask pattern M1, a second mask pattern M2, which has smaller widths than the first mask pattern M1, may be used. In this case, the second electrode material 242, the insulating material 252, the oxygen-containing material 222, and the first electrode material 212 may be etched using the second mask pattern M2 as an etching barrier, thereby forming synapses having the structure of the synapse 200B shown in FIG. 6B, for example.

The neuromorphic device according to the above-described embodiments may be used in various devices or systems, examples of which are described with reference to FIG. 8.

Figure 8:
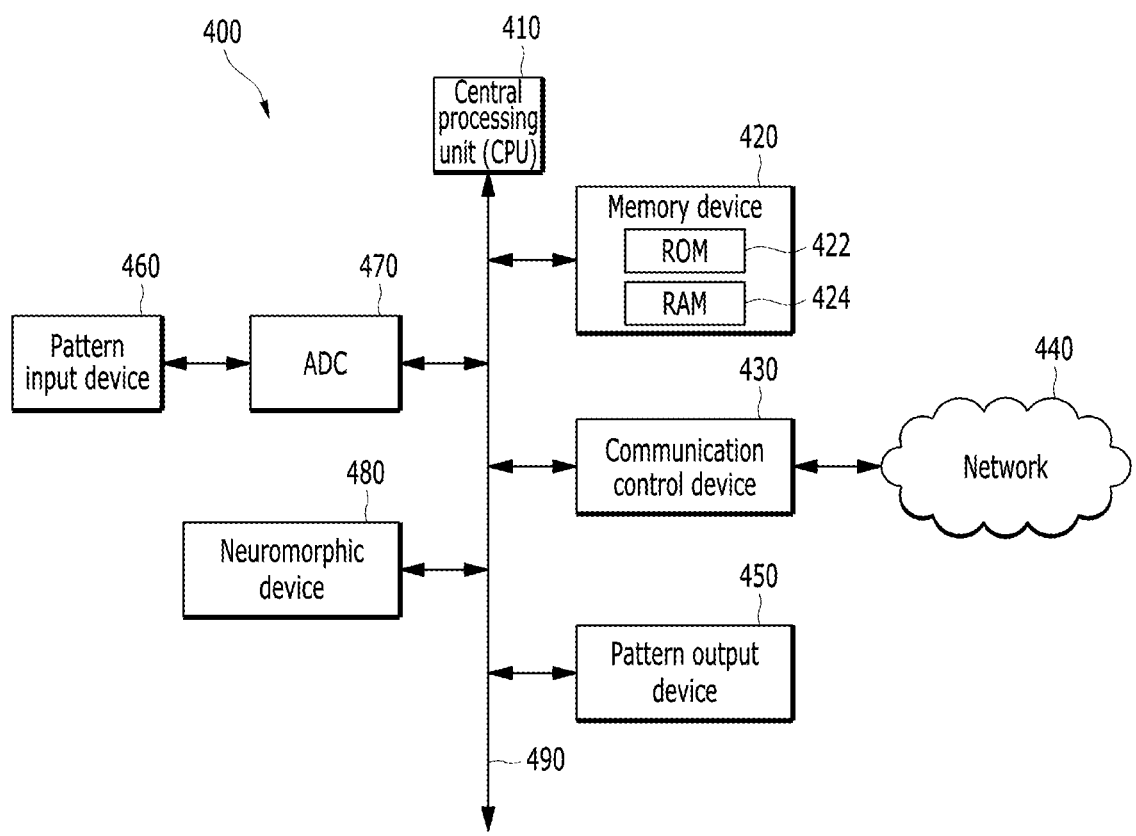
FIG. 8 shows a pattern recognition system according to an embodiment.

FIG. 8 shows a pattern recognition system 400 according to an embodiment.

The pattern recognition system 400 may be a system for recognizing various patterns, such as a speech recognition system or an image recognition system. The pattern recognition system 400 may be configured with the neuromorphic device of the above-described embodiments.

Referring to FIG. 8, the pattern recognition system 400 may include a central processing unit (CPU) 410, a memory device 420, a communication control device 430, a pattern output device 450, a pattern input device 460, an analog-digital converter (ADC) 470, a neuromorphic device 480, a bus line 490, and the like. The pattern recognition system 400 is connected to a network 440 through the communication control device 430.

The central processing unit 410 may generate and transmit various signals used in a learning operation to be performed by the neuromorphic device 480, and may perform various processing operations for recognizing patterns of sound, images or the like based on an output of the neuromorphic device 480. This central processing unit 410 may be connected, via the bus line 490, to the memory device 420, the communication control device 430, the pattern output device 450, the analog-digital converter 470, and the neuromorphic device 480.

The memory device 420 may store information in accordance with operations of the pattern recognition system 400. For this, the memory device 420 may include different memory devices. For example, the memory device 420 may include a ROM device 422, a RAM device 424, and the like. The ROM device 422 may store various programs or data which are used in the central processing unit 410 in order to perform the learning operation of the neuromorphic device 480, pattern recognition, etc. The RAM device 424 may store the program or data downloaded from the ROM device 422, or store data, such as sound or images, which have been converted or analyzed by the analog-digital converter 470.

The communication control device 430 may exchange recognized data (e.g., sound or images) with other communication control devices through the network 440.

The pattern output device 450 may output the recognized data (e.g., sound or images) in various manners. For example, the pattern output device 450 may include one or more of a printer, a display unit, and the like, and may output sound waveforms or display images.

The pattern input device 460 may receive analog-type sound, images, etc., and may include one or more of a microphone, a camera, etc.

The analog-digital converter 470 may convert analog data, provided by the pattern input device 460, to digital data, and may also analyze the digital data.

The neuromorphic device 480 may perform learning, recognition, and the like using data provided by the analog-digital converter 470, and may output data corresponding to recognized patterns. The neuromorphic device 480 may include one or more neuromorphic devices that include synapses of the embodiments described above. For example, the neuromorphic device 480 may include a plurality of synapses, and each of the plurality of synapses may include a first electrode; a second electrode spaced apart from the first electrode; an oxygen-containing layer disposed between the first electrode and the second electrode, the oxygen-containing layer including oxygen ions; and a reactive metal layer disposed between the oxygen-containing layer and the second electrode, the reactive metal layer being capable of reacting with the oxygen ions of the oxygen-containing layer, and wherein a width of the reactive metal layer decreases along a direction toward the oxygen-containing layer from the second electrode. By using this configuration, the symmetry and linearity of the electrical conductivity of a synapse can be ensured. Accordingly, operating characteristics of the neuromorphic device 480 can be improved, and thus operating characteristics of the pattern recognition system 400 may also be improved.

The pattern recognition system 400 may further include other components required for properly performing its function(s). For example, the pattern recognition system 400 may further include one or more input devices such as a keyboard, a mouse and the like so as to receive various parameters and/or setting conditions for operations of the pattern recognition system 400.

According to the embodiments as described above, the symmetry and linearity of the electrical conductivity of the synapse may be enhanced, and thus the operating characteristics of the neuromorphic device may be improved.

While the present invention has been described with respect to the specific embodiments, it will be apparent to those skilled in the art that various changes and modifications may be made without departing from the spirit and scope of the invention as defined in the following claims.

What is claimed is:

1. A synapse comprising:
    a first electrode;
    a second electrode spaced apart from the first electrode;
    an oxygen-containing layer disposed between the first electrode and the second electrode, the oxygen-containing layer including oxygen ions; and
    a reactive metal layer disposed between the oxygen-containing layer and the second electrode, the reactive metal layer being capable of reacting with the oxygen ions of the oxygen-containing layer, and
    wherein a width of the reactive metal layer decreases along a direction toward the oxygen-containing layer from the second electrode.

2. The synapse of claim 1, further comprising:
    an insulating layer disposed against a side surface of the reactive metal layer and disposed between the first electrode and the second electrode, the insulating layer encircling the reactive metal layer.

3. The synapse of claim 1, wherein a side surface of the reactive metal layer extends between the first electrode and the second electrode at an oblique angle.

4. The synapse of claim 1, wherein a side surface of the reactive metal layer extends between the first electrode and the second electrode, the side surface having a stair shape.

5. The synapse of claim 1, wherein the reactive metal layer includes a first portion and a second portion, a width of the first portion of the reactive metal layer being substantially constant from the second electrode to a certain distance from the second electrode, a width of the second portion decreasing from the certain distance to the oxygen-containing layer.

6. The synapse of claim 1, wherein a dielectric oxide layer forms or disappears according to a voltage or current applied through the first electrode and the second electrode, the dielectric oxide layer being formed in the reactive metal layer at an interface between the reactive metal layer and the oxygen-containing layer by a reaction between the reactive metal layer and the oxygen ions.

7. The synapse of claim 6, wherein the width of a first portion of the reactive metal layer is substantially constant from the second electrode to a certain distance from the second electrode, and a width of a second portion of the reactive metal layer decreases from the certain distance to the oxygen-containing layer, and
    wherein the dielectric oxide layer forms or disappears in the second portion of the reactive metal layer.

8. The synapse of claim 1, wherein the synapse undergoes a depression operation when first electrical pulses are applied to the synapse through the first and second electrodes, an electrical conductivity of the synapse decreasing when a number of the first electrical pulses increases, the first electrical pulses having a first polarity, and wherein the synapse undergoes a potentiation operation when second electrical pulses are applied to the synapse through the first and second electrodes, the electrical conductivity of the synapse increasing when a number of the second electrical pulses increases, the second electrical pulses having a second polarity opposite to the first polarity.

9. A neuromorphic device comprising:
a first neuron;
a second neuron;
a first line connected to the first neuron, the first line extending in a first direction;
a second line connected to the second neuron, the second line extending in a second direction and intersecting the first line; and
a synapse disposed in an intersection region between the first line and the second line,
wherein the synapse comprises:
an oxygen-containing layer including oxygen ions; and
a reactive metal layer disposed between the oxygen-containing layer and the second line, the reactive metal layer being capable of reacting with the oxygen ions of the oxygen-containing layer, and
wherein a width of the reactive metal layer decreases along a third direction toward the oxygen-containing layer from the second line.

10. The neuromorphic device of claim 9, wherein a dielectric oxide layer forms or disappears according to a voltage or current applied to the synapse through the first line and the second line, the dielectric oxide layer being formed in the reactive metal layer at an interface between the reactive metal layer and the oxygen-containing layer by a reaction between the reactive metal layer and the oxygen ions.

11. The neuromorphic device of claim 10, wherein an electrical conductivity of the synapse decreases as a thickness of the dielectric oxide layer increases, and
wherein the electrical conductivity of the synapse increases as the thickness of the dielectric oxide layer decreases.

12. The neuromorphic device of claim 10, wherein at least one of the first neuron and the second neuron drives at least one of the first line and the second line by first and second electrical pulses, the first and second electrical pulses being applied to the synapse through the at least one of the first line and the second line, the first electrical pulses having a first polarity, the second electrical pulses having a second polarity opposite to the first polarity,
wherein a thickness of the dielectric oxide layer increases when a number of the first electrical pulses applied to the synapse increases, and
wherein the thickness of the dielectric oxide layer decreases when a number of the second electrical pulses applied to the synapse increases.

13. The neuromorphic device of claim 12, wherein a volume of the dielectric oxide layer increases at a growth rate, the growth rate increasing as the number of the first electrical pulses increases.

14. The neuromorphic device of claim 9, wherein the synapse further comprises:
an insulating layer disposed against a side surface of the reactive metal layer and disposed between the first line and the second line, the insulating layer encircling the reactive metal layer.

15. The neuromorphic device of claim 9, wherein a side surface of the reactive metal layer extends between the first line and the second line at an oblique angle.

16. The neuromorphic device of claim 9, wherein a side surface of the reactive metal layer extends between the first line and the second line, the side surface having a stair shape.

17. The neuromorphic device of claim 9, wherein the reactive metal layer includes a first portion and a second portion, a width of the first portion being substantially constant from the second line to a certain distance from the second line, a width of the second portion decreasing from the certain distance to the oxygen-containing layer.

* * * * *